(12) United States Patent
Heng et al.

(10) Patent No.: US 9,947,822 B2
(45) Date of Patent: Apr. 17, 2018

(54) BIFACIAL PHOTOVOLTAIC MODULE USING HETEROJUNCTION SOLAR CELLS

(71) Applicant: SolarCity Corporation, San Mateo, CA (US)

(72) Inventors: Jiunn Benjamin Heng, San Jose, CA (US); Christoph Erben, Los Gatos, CA (US); Bobby Yang, Los Altos Hills, CA (US)

(73) Assignee: Tesla, Inc., Palo Alto, CA (US)

( * ) Notice: Subject to any disclaimer, the term of this patent is extended or adjusted under 35 U.S.C. 154(b) by 294 days.

(21) Appl. No.: 14/611,988

(22) Filed: Feb. 2, 2015

(65) Prior Publication Data

US 2016/0225931 A1    Aug. 4, 2016

(51) Int. Cl.
*H01L 31/02* (2006.01)
*H01L 31/0224* (2006.01)
(Continued)

(52) U.S. Cl.
CPC ...... *H01L 31/0725* (2013.01); *H01L 31/0201* (2013.01); *H01L 31/02013* (2013.01);
(Continued)

(58) Field of Classification Search
CPC ............... H01L 31/02; H01L 31/02002; H01L 31/0201; H01L 31/02013; H01L 31/0224;
(Continued)

(56) References Cited

U.S. PATENT DOCUMENTS

| 819,360 A | 3/1902 | Mayer |
| 2,626,907 A | 1/1953 | De Groote |

(Continued)

FOREIGN PATENT DOCUMENTS

| CN | 1253381 | 5/2000 |
| CN | 1416179 | 10/2001 |

(Continued)

OTHER PUBLICATIONS

Parthavi, "Doping by Diffusion and Implantation", <http://www.leb.eei.uni-erlangen.de/winterakademie/2010/report/course03/pdf/0306.pdf>.

(Continued)

*Primary Examiner* — Susan D Leong
(74) *Attorney, Agent, or Firm* — Shun Yao; Park, Vaughan, Fleming & Dowler LLP

(57) ABSTRACT

One embodiment of the present invention provides a bifacial solar panel. The bifacial solar panel includes a first transparent cover on a first side of the solar panel, a second transparent cover on a second side of the solar panel, a plurality of solar cells sandwiched between the first cover and the second cover, and one or more lead wires for outputting power generated by the solar panel. The lead wires are positioned on an edge of the solar panel without shading the first and second sides of the solar panel. A respective solar cell comprises a photovoltaic structure, a first metal grid on the first side of the photovoltaic structure, which allows the solar cell to absorb light from the first side, and a second metal grid on the second side of the photovoltaic structure, which allows the solar cell to absorb light from the second side.

10 Claims, 9 Drawing Sheets

(51) Int. Cl.
  *H01L 31/042* (2014.01)
  *H01L 31/05* (2014.01)
  *H01L 31/0725* (2012.01)
  *H01L 31/068* (2012.01)
  *H01L 31/0747* (2012.01)
  *H02S 40/34* (2014.01)
  *H01L 31/0216* (2014.01)
  *H01L 31/048* (2014.01)
  *H01L 31/18* (2006.01)

(52) U.S. Cl.
  CPC ............ *H01L 31/02167* (2013.01); *H01L 31/022433* (2013.01); *H01L 31/022466* (2013.01); *H01L 31/0488* (2013.01); *H01L 31/0504* (2013.01); *H01L 31/0684* (2013.01); *H01L 31/0747* (2013.01); *H01L 31/18* (2013.01); *H01L 31/1884* (2013.01); *H02S 40/34* (2014.12); *Y02E 10/547* (2013.01)

(58) Field of Classification Search
  CPC ..... H01L 31/022425; H01L 31/022433; H01L 31/0236; H01L 31/0465; H01L 31/05; H01L 31/0504; H01L 31/0508
  See application file for complete search history.

(56) References Cited

U.S. PATENT DOCUMENTS

| | | |
|---|---|---|
| 2,938,938 A | 5/1960 | Dickson |
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |

(56) References Cited

U.S. PATENT DOCUMENTS

| | | |
|---|---|---|
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0062041 A1* | 3/2005 | Terakawa ............ H01L 31/0747 257/53 |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1* | 11/2006 | Takeyama ....... H01L 31/022425 136/252 |
| 2006/0272698 A1* | 12/2006 | Durvasula ........... H01L 31/0547 136/246 |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0041436 A1* | 2/2008 | Lau ................. H01L 31/022425 136/244 |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1* | 7/2008 | Abdallah ............... H01L 31/075 136/258 |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0139512 A1 | 6/2009 | Lima |
| 2009/0151783 A1 | 6/2009 | Lu |
| 2009/0155028 A1 | 6/2009 | Boguslayskiy |
| 2009/0160259 A1 | 6/2009 | Ravindranath |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1* | 4/2010 | Carlson ................. H01L 31/062 136/255 |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1* | 9/2010 | Khajehoddin ............ G05F 1/67 136/252 |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0307592 A1 | 12/2010 | Chang |
| 2010/0313877 A1 | 12/2010 | Bellman |
| 2010/0326518 A1 | 12/2010 | Juso |
| 2011/0005569 A1 | 1/2011 | Sauar |

(56) References Cited

U.S. PATENT DOCUMENTS

| | | |
|---|---|---|
| 2011/0005920 A1 | 1/2011 | Ivanov |
| 2011/0073175 A1 | 3/2011 | Hilali |
| 2011/0088762 A1 | 4/2011 | Singh |
| 2011/0146759 A1* | 6/2011 | Lee ............... H01L 31/0504 136/249 |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1* | 12/2011 | Jaus ............... H01L 31/022425 136/246 |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel et al. |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1* | 6/2013 | Beckerman ......... H01L 31/0488 136/251 |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng et al. |
| 2014/0242746 A1 | 8/2014 | Albadri |
| 2014/0261624 A1* | 9/2014 | Cruz-Campa ........... H01L 31/18 136/246 |
| 2014/0318611 A1 | 10/2014 | Moslehi |
| 2014/0345674 A1 | 11/2014 | Yang et al. |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |

FOREIGN PATENT DOCUMENTS

| | | |
|---|---|---|
| CN | 101233620 | 7/2008 |
| CN | 101553933 | 10/2009 |
| CN | 101305454 | 5/2010 |
| CN | 102088040 | 6/2011 |
| CN | 102263157 | 11/2011 |
| DE | 4030713 | 4/1992 |
| DE | 102006009194 | 8/2007 |
| DE | 102008045522 | 3/2010 |
| DE | 102010061317 | 6/2012 |
| DE | 10201201051 | 11/2013 |
| EP | 2113946 | 11/2009 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | 10004204 | 1/1998 |
| JP | 2000164902 | 6/2000 |
| JP | 2006324504 | 11/2006 |
| JP | 2013526045 | 6/2013 |
| KR | 20090011519 A | 2/2009 |
| WO | 9120097 A1 | 12/1991 |
| WO | 1991017839 | 10/2003 |
| WO | 2006097189 A1 | 9/2006 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010104726 A2 | 9/2010 |
| WO | 2010123974 | 10/2010 |
| WO | 2010123974 A1 | 10/2010 |
| WO | 2011005447 A2 | 1/2011 |
| WO | 2011008881 A2 | 1/2011 |
| WO | 2011053006 | 5/2011 |
| WO | 2011123646 A2 | 10/2011 |

(56) References Cited

FOREIGN PATENT DOCUMENTS

| WO | 2013020590 | 2/2013 |
|---|---|---|
| WO | 2013046351 | 4/2013 |
| WO | 2014066265 | 5/2014 |
| WO | 2014117138 | 7/2014 |
| WO | 2015183827 | 12/2015 |
| WO | 2016090332 | 6/2016 |

OTHER PUBLICATIONS

Weiss, "Development of different copper seed layers with respect to the copper electroplating process," Microelectronic Engineering 50 (2000) 443-440, Mar. 15, 2000.
Tomasi, "Back-contacted Silicon Heterojunction Solar Cells With Efficiency<21%" 2014 IEEE.
Hornbachner et al., "Cambered Photovoltaic Module and Method for its Manufacture" Jun. 17, 2009.
Machine translation of JP 10004204 A, Shindou et al.
Jianhua Zhao et al. "24% Efficient perl silicon solar cell: Recent improvements in high efficiency silicon cell research".
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.
WP Leroy et al., "In Search for the Limits of Rotating Cylindrical Magnetron Sputtering", Magnetron, ION Processing and ARC Technologies European Conference, Jun. 18, 2010, pp. 1-32.
Beaucarne G et al: 'Epitaxial thin-film Si solar cells' Thin Solid Films, Elsevier-Sequoia S.A. Lausanne, CH LNKD-DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Chabal, Yves J. et al., 'Silicon Surface and Interface Issues for Nanoelectronics,' The Electrochemical Society Interface, Spring 2005, pp. 31-33.
Collins English Dictionary (Convex. (2000). In Collins English Dictionary. http://search.credoreference.com/content/entry/hcengdict/convex/0 on Oct. 18, 2014).
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20l.pptx> and converted to PDF.
Davies, P.C.W., 'Quantum tunneling time,' Am. J. Phys. 73, Jan. 2005, pp. 23-27.
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Green, Martin A. et al., 'High-Efficiency Silicon Solar Cells,' IEEE Transactions on Electron Devices, vol. ED-31, No. 5, May 1984, pp. 679-683.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heteroj unction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.
O'Mara, W.C.; Herring, R.B.; Hunt L.P. (1990). Handbook of Semiconductor Silicon Technology. William Andrew Publishing/Noyes. pp. 275-293.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

* cited by examiner

BIFACIAL PHOTOVOLTAIC MODULE USING HETEROJUNCTION SOLAR CELLS

BACKGROUND

Field

This disclosure is generally related to the fabrication of solar panels. More specifically, this disclosure is related to fabrication of a bifacial photovoltaic module using heterojunction solar cells.

Related Art

The negative environmental impact of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

For homojunction solar cells, minority-carrier recombination at the cell surface due to the existence of dangling bonds can significantly reduce the solar cell efficiency; thus, a good surface passivation process is needed. In addition, the relatively thick, heavily doped emitter layer, which is formed by dopant diffusion, can drastically reduce the absorption of short wavelength light. Comparatively, heterojunction solar cells, such as Si heterojunction (SHJ) solar cells, are advantageous. FIG. 1 presents a diagram illustrating an exemplary SHJ solar cell (prior art). SHJ solar cell 100 includes front grid electrode 102, a heavily doped amorphous-silicon (a-Si) emitter layer 104, an intrinsic a-Si layer 106, a crystalline-Si substrate 108, and back grid electrode 110. Arrows in FIG. 1 indicate incident sunlight. Because there is an inherent bandgap offset between a-Si layer 106 and crystalline-Si (c-Si) layer 108, a-Si layer 106 can be used to reduce the surface recombination velocity by creating a barrier for minority carriers. The a-Si layer 106 also passivates the surface of crystalline-Si layer 108 by repairing the existing Si dangling bonds. Moreover, the thickness of heavily doped a-Si emitter layer 104 can be much thinner compared to that of a homojunction solar cell. Thus, SHJ solar cells can provide a higher efficiency with higher open-circuit voltage ($V_{oc}$) and larger short-circuit current ($J_{sc}$).

In order to achieve even higher efficiency, improvements on the solar cell structure are needed. Moreover, because in practice solar cells are interconnected, assembled, and packaged together to form a solar panel, it is just as important to design a solar panel that can extract as much power as possible from its solar cells.

SUMMARY

One embodiment of the present invention provides a bifacial solar panel. The bifacial solar panel includes a first transparent cover on a first side of the solar panel, a second transparent cover on a second side of the solar panel, a plurality of solar cells sandwiched between the first cover and the second cover, and one or more lead wires for outputting power generated by the solar panel. The lead wires are positioned on an edge of the solar panel without shading the first and second sides of the solar panel. A respective solar cell comprises a photovoltaic structure, a first metal grid on the first side of the photovoltaic structure, which allows the solar cell to absorb light from the first side, and a second metal grid on the second side of the photovoltaic structure, which allows the solar cell to absorb light from the second side.

In one variation on this embodiment, the solar cell is a double-sided heterojunction solar cell, which includes a first transparent conducting oxide layer positioned on the first side of the photovoltaic structure and a second transparent conducting oxide layer positioned on the second side of the photovoltaic structure.

In a further variation, the first and second transparent conducting oxide layers have different thicknesses. A thickness of the first transparent conducting oxide layer is configured for absorption of substantially white and direct light by the photovoltaic structure, and a thickness of the second transparent conducting oxide layer is configured for absorption of substantially scattered or diffused light by the photovoltaic structure.

In one variation on this embodiment, the first and second metal grids have different finger spacing.

In one variation on this embodiment, the first metal grid comprises a first edge busbar located at an edge on the first side of the solar cell, and the second metal grid comprises a second edge busbar located at an opposite edge on the second side of the solar cell.

In a further variation, two adjacent solar cells are arranged in such a way that a first edge busbar on a first side of one solar cell is in direct contact with a second edge busbar on a second side of the other solar cell, thereby facilitating a serial connection between the two adjacent solar cells.

In one variation on this embodiment, busbars of the first and second metal grids are covered with a light-capturing film.

In one variation on this embodiment, regions on the second cover that are not covered by the solar cells are covered with a light-capturing film.

In one variation on this embodiment, the solar panel is frameless.

In one variation on this embodiment, the solar panel further comprises a plurality of maximum power point tracking devices. A respective maximum power point tracking device is coupled to a respective solar cell or a group of solar cells.

In one variation on this embodiment, the first cover comprises glass, and the second cover comprises glass or polymer.

BRIEF DESCRIPTION OF THE FIGURES

In the figures, like reference numerals refer to the same figure elements.

DETAILED DESCRIPTION

Figure 1:
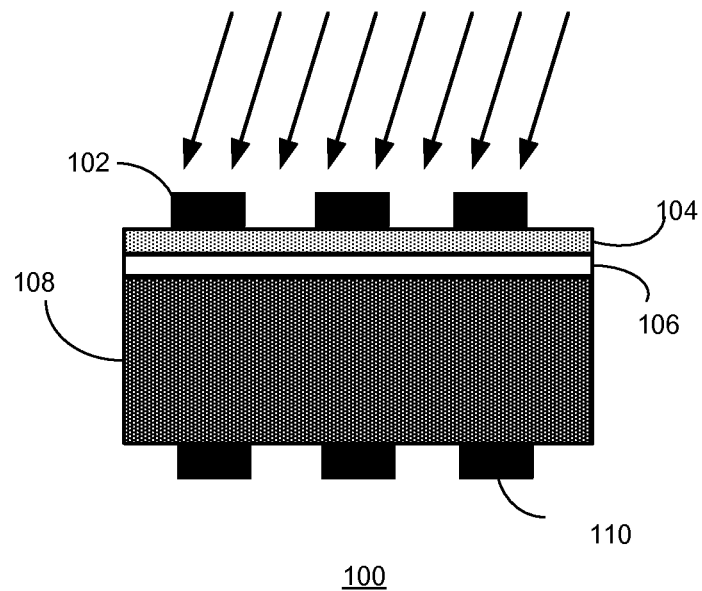
FIG. 1 presents a diagram illustrating an exemplary SHJ solar cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar panel that is optimized for bifacial operation. More specifically, the solar panel includes a transparent glass front cover and a transparent glass or polymer back cover. Sandwiched between the two covers are inter-connected heterojunction solar cells, which can include double-sided heterojunction solar cells. The wiring of the solar panel is carefully designed to reduce or minimize shading effects on the backside of the panel. For example, instead of using a junction box attached at the backside of the panel, the electrical wiring that couples strings of solar cells and the components typically included in a junction box are placed at the edge of the panel or the junction box is attached to the backside of the panel without shading any solar cells. To increase the amount of light absorbed by the solar cells, light-capturing films are applied to locations on the panel that are not covered by cells and to the top surface of the busbars/tabbing ribbons. Other efforts are made to further reduce series resistance, such as using solar cells with a single busbar configuration and arranging such solar cells in a shingled pattern.

In this disclosure, the terms "sun-facing side" and "front-side" refer to the side of a solar cell that receives direct sun light. The terms "the side that faces away from direct sun light" and "backside" refer to the side opposite the sun-facing side of the solar cell. However, these terms should not be interpreted to mean that sun light is not absorbed on the back side. The solar cell and panel as described herein can receive light on both the front side and back side. A solar cell can absorb scattered sun light from its back side, especially when the solar panels are elevated from a flat surface, such as in a solar farm environment. In certain situations, such as being placed in a desert environment, the bifacial solar panel can be mounted vertically to not only absorb light on both sides but prevent accumulation of dust particles. In yet another situation, such as being placed in a heavy snow environment, the bifacial solar panel can be mounted in a flat tilt configuration and is able to significantly prevent snow build-up on the sun-facing side, because the back side is still absorbing scattered light, thus enabling adequate heating of the panel to melt the snow on sun-facing side.

Double-Sided Heterojunction Solar Cell

It has been shown that double-sided heterojunction solar cells can provide superior performance because the built-in heterojunction field at both surfaces of the solar cell base layer passivates the surfaces, thus preventing recombination at both the front and back junctions. Moreover, certain heterojunction solar cells also include quantum-tunneling barrier (QTB) layers that can effectively passivate the surfaces of the base layer without compromising the carrier collection efficiency, thus further improving the solar cell performance.

Figure 2:
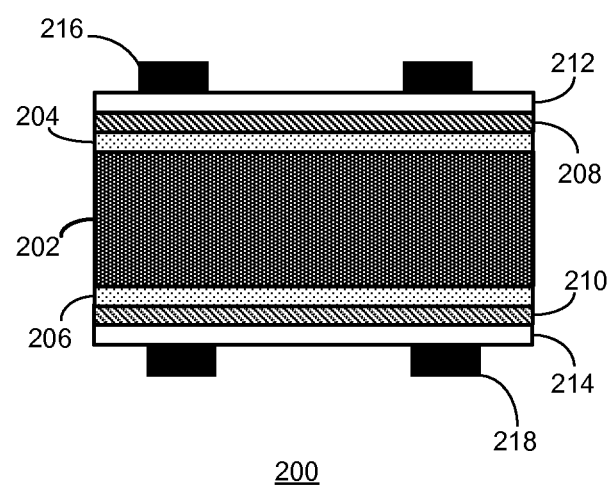
FIG. 2 presents a diagram illustrating an exemplary double-sided tunneling junction solar cell, in accordance with an embodiment of the present invention.

FIG. 2 presents a diagram illustrating an exemplary double-sided tunneling junction solar cell, in accordance with an embodiment of the present invention. Double-sided tunneling junction solar cell 200 includes a base layer 202, quantum tunneling barrier (QTB) layers 204 and 206 covering both surfaces of base layer 202 and passivating the surface-defect states, a front-side doped a-Si layer forming a front emitter 208, a back-side doped a-Si layer forming a BSF layer 210, a front transparent conducting oxide (TCO) layer 212, a back TCO layer 214, a front metal grid 216, and a back metal grid 218. Note that it is also possible to have the emitter layer at the backside and a front surface field (FSF) layer at the front side of the solar cell. Moreover, base layer 202 can include epitaxially grown crystalline-Si (c-Si) thin film or can be a c-Si wafer. Details, including fabrication methods, about double-sided tunneling junction solar cell 200 can be found in U.S. Pat. No. 8,686,283, entitled "Solar Cell with Oxide Tunneling Junctions," by inventors Jiunn Benjamin Heng, Chentao Yu, Zheng Xu, and Jianming Fu, filed 12 Nov. 2010, the disclosure of which is incorporated by reference in its entirety herein.

In general, metallic contacts are used on surfaces of a solar cell, such as metal grids 216 and 218, to collect the current generated by the solar cell. A metal grid typically includes two types of metal lines: fingers and busbars. Fingers are fine metal lines, usually laid out in parallel with substantially equal distance between one another, to collect current generated by the solar cell. Busbars are wider metal strips coupled to all the fingers to aggregate all the collected current and facilitate coupling to external leads (such as metal tabs). Note that the layout pattern of fingers is not limited to parallel lines. Loops, "snake" shaped layout patterns, and other patterns can be used to reduce the chances of peeling-off of the metal grid.

Figure 3A:
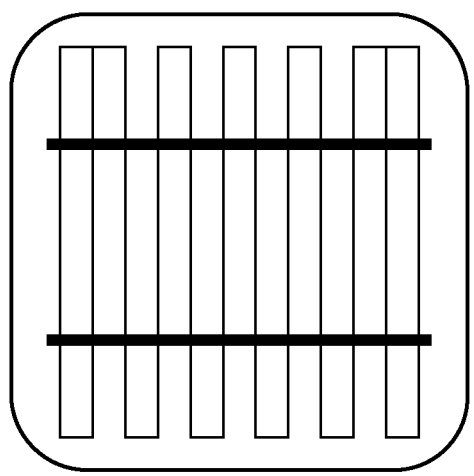
FIG. 3A presents a diagram illustrating an exemplary conventional metal grid pattern with double busbars.
Figure 3B:
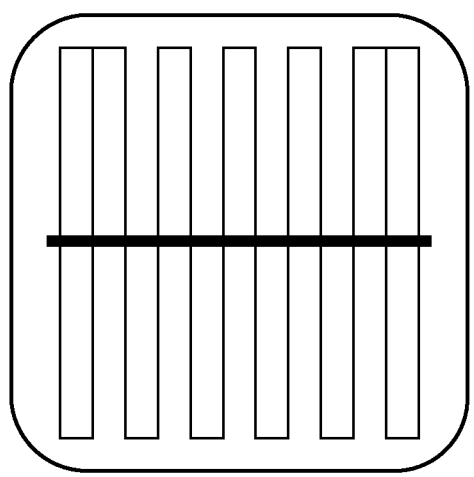
FIG. 3B presents a diagram illustrating an exemplary metal grid pattern with a single center busbar.
Figure 3C:
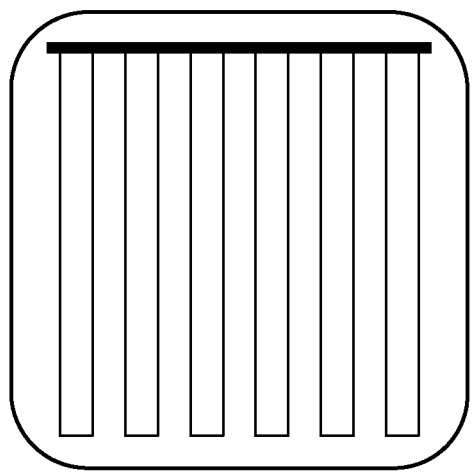
FIG. 3C presents a diagram illustrating an exemplary metal grid pattern with a single edge busbar.

In some embodiments, metal grids 216 and 218 can be arranged in various grid patterns, including but not limited to: a conventional grid pattern with double busbars, a single center busbar grid pattern, and a single edge busbar grid pattern. FIG. 3A presents a diagram illustrating an exemplary conventional metal grid pattern with double busbars. FIG. 3B presents a diagram illustrating an exemplary metal grid pattern with a single center busbar. FIG. 3C presents a diagram illustrating an exemplary metal grid pattern with a single edge busbar. Note that, in FIGS. 3A-3C, the finger lines are formed in a loop pattern at either end, with a "snake" pattern in between to reduce the number of open ends or discontinuation points. Other grid patterns are also possible. In one embodiment, in the single edge busbar configuration as illustrated in FIG. 3C, the busbars on the front and back surfaces of the solar cell are located at opposite edges.

One key consideration in designing the metal grids is the balance between the increased resistive losses associated with a widely spaced grid and the increased reflection and shading effect caused by metal coverage of the surface. In most solar cells, the metal grid on the sun-facing side of the solar cell is designed in such a way as to optimize light absorption. On the other hand, the metal grid on the side facing away from the sun can be optimized for minimum series resistance. These different optimization considerations can lead to the front-side and backside metal grids having different finger spacing. In some embodiments of the present invention, the finger spacing is smaller on the backside of the solar cell than on the front-side of the solar cell. The existence of the front and back junctions of double-sided tunneling junction solar cells means that such solar cells are inherently bifacial. Using a metal grid (such as metal grid 218 shown in FIG. 2) as the backside electrode can effectively enable more light to be collected from the backside of such solar cells. More specifically, the spacing between the grid lines enables light to enter the solar cell from its backside. One can observe increased photo-generated current when the backside electrode is a metal grid instead of the conventional metal-sheet electrode, even though the solar cells are placed in a solar panel that has an opaque backside cover. This is because light that passes through the solar cells is reflected by the opaque (often white) backside cover (also called a back sheet) back into the solar cell through the backside metal grids.

In addition to designing the front and back metal grids to optimize the performance of the bifacial solar cells, one can also adjust the thickness of the front and back TCO layers to maximize light absorption. For example, the front-side of the solar cell in general receives direct sunlight, which can be considered white light; hence, it is desirable to design the front-side TCO layer to optimize the absorption of white light. The front-side TCO layer has a thickness of approximately 100-1200 nm. In one embodiment, the front-side TCO layer is approximately 700 nm thick. The backside of the solar cell receives mostly scattered or diffused light, which has more shorter-wavelength component. Thus, it is desirable to design the backside TCO layer to optimize the absorption of light with shorter wavelength (i.e., TCO that has a higher transparency for longer-wavelength light). In some embodiments, the thickness of the backside TCO layer is decreased compared with the front-side TCO layer to optimize shorter-wavelength absorption. For example, the backside TCO layer can be 400 nm thick. Note that, the thinner backside TCO layer can lead to increased resistance, which can be possibly compensated by using narrower gridline spacing.

Bifacial Solar Panel

The double-sided tunneling junction solar cells provide superior performance due to their ability to absorb light from the backside. Such backside light absorption can produce more energy if these cells are placed into a bifacial panel, i.e., a panel with a transparent or semi-transparent back cover to allow scattered light to enter the backside of the solar cells through the back cover. Such bifacial panels can lead to a 2-12% increase in performance when compared with the conventional single-sided panels. The performance improvement can be more prominent during a cloudy or low irradiance day because the bifacial panel can more effectively collect the diffused light. Although simply changing the non-transparent back sheet of a conventional single-sided panel to a transparent back sheet can improve the panel's performance, more can be done to further improve the overall efficiency of a bifacial panel.

One way to optimize the performance of a bi-facial panel is to reduce backside shading as much as possible. Because bifacial panels are designed to absorb light from both sides, shading or partial shading of one or more cells from the backside can lead to reduced current output of the entire panel. Moreover, the mismatched current among serially connected cells may also generate hotspots on the panel, because the back shaded cell may be reverse-biased by the non-shaded cells.

Figure 4:
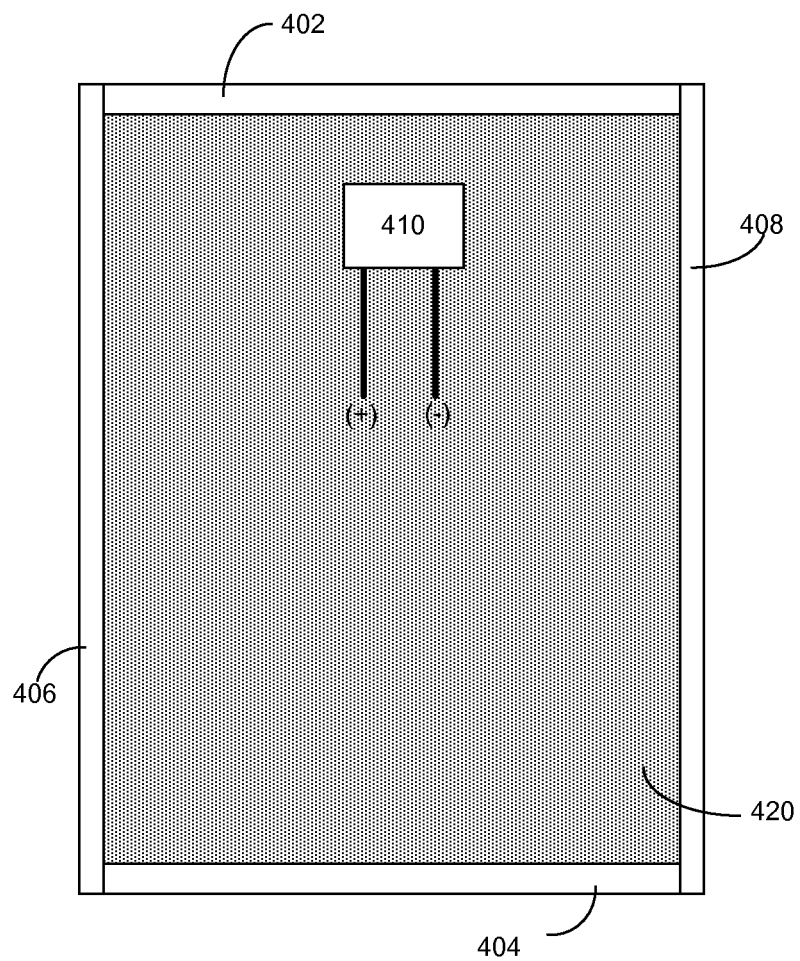
FIG. 4 presents a diagram illustrating the backside of a conventional solar panel.

To minimize backside shading, in one embodiment of the present invention, the junction box that is conventionally located on the backside of a panel is removed. FIG. 4, which presents a diagram illustrating the backside of a conventional solar panel. In FIG. 4, a solar panel 400 includes a pair of end frames 402 and 404, a pair of side frames 406 and 408, a junction box 410, and an opaque back sheet 420. The frames 402-408 enclose and provide support to solar cells encapsulated within the front and back covers. Junction box 410 provides connections between solar panel 400 and other solar panels. In addition, junction box 410 may include other circuit components, such as bypass diodes, that facilitate operation of solar panel 400. This arrangement, however, will cause backside shading to the bifacial panel because the junction box blocks light entering from the backside of the panel. Moreover, the wirings that connect the junction boxes of different panels can also cause backside shading.

To minimize backside shading, in some embodiments, the bifacial solar panel can have junction box having a smaller profile mounted on the edge of the panel or on the backside of the panel without any shading to the solar cells, and the wirings used for inter-panel connections are placed along and within the edge frame of the panel. Moreover, conventional aluminum (Al) based frames often partially cover the backside of cells at the edges of the solar panel, or may cast shadows onto the backside of the cells. To prevent such backside shading caused by the Al frames (such as end frames 402 and 404, and side frames 406 and 408 shown in FIG. 4), the bifacial panel can be frameless, wherein the front and back covers jointly provide the physical support for the entire panel. In one embodiment, clamps are used to mount frameless bifacial panels without any shading to the solar cells. In another embodiment, custom designed frames that do not introduce any shading and shadowing to the front or back of the solar cells can also be used to support the bifacial panels.

Figure 5:
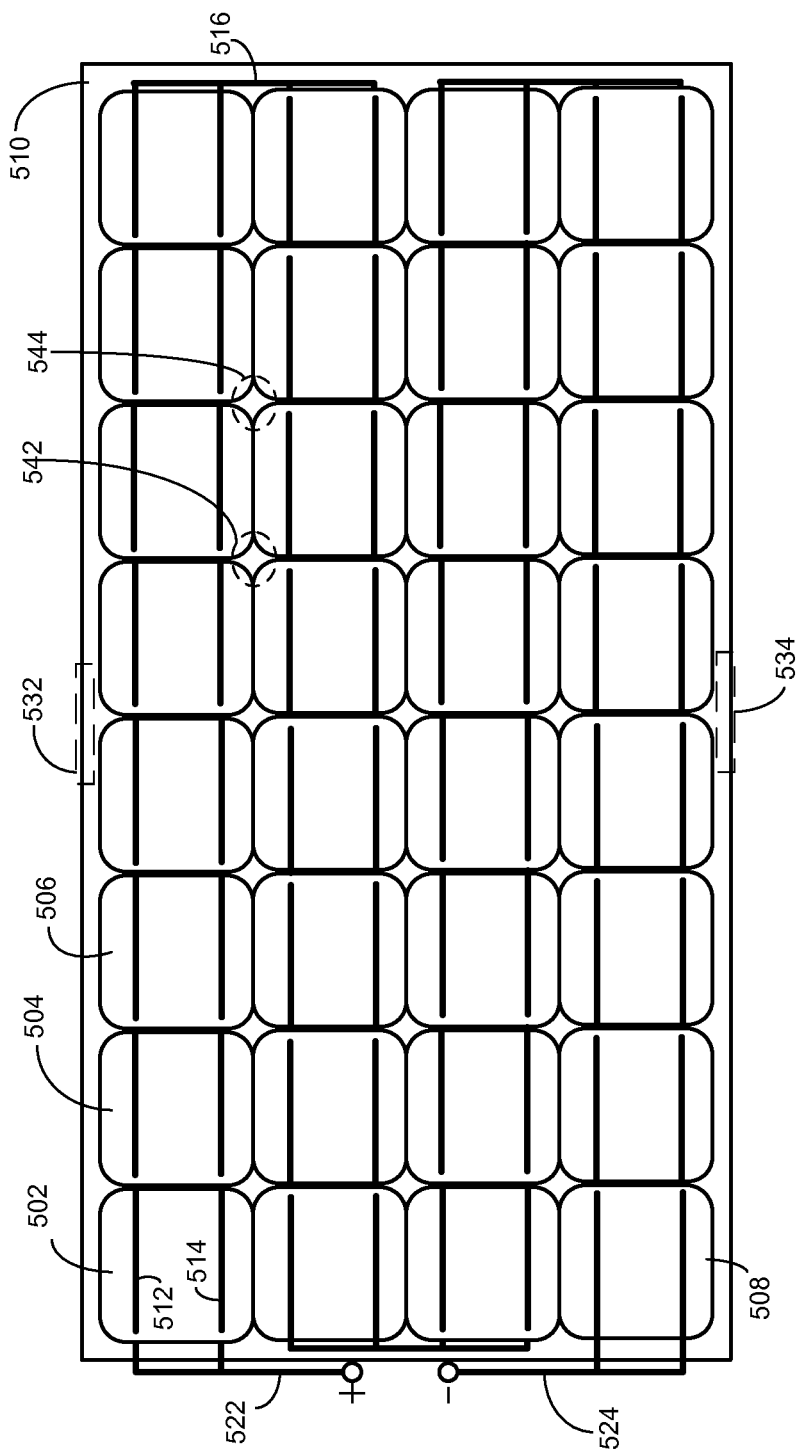
FIG. 5 presents a diagram illustrating the backside of an exemplary bifacial solar panel, in accordance with an embodiment of the present invention.

FIG. 5 presents a diagram illustrating the backside of an exemplary bifacial solar panel, in accordance with an embodiment of the present invention. In FIG. 5, a solar panel 500 includes a plurality of solar cells, such as cells 502, 504, 506, and 508, sandwiched between a front-side cover and a backside cover. Note that FIG. 5 only shows backside cover 510. The solar cells can include double-sided tunneling junction solar cells. In some embodiments, backside cover 510 is made of glass.

A glass backside cover not only facilitates light absorption from the backside of the cells, but also ensures sufficient blockage of moisture. Moisture insulation is important to panels based on heterojunction solar cells, because most heterojunction solar cells include one or more TCO layers, which function as both anti-reflection coatings (ARCs) and electrodes for collecting carriers. Many TCO materials, such as ZnO or Al:ZnO, are moisture-sensitive and may lose their material properties when exposed to moisture. For example, a ZnO film may become rough or porous when exposed to moisture for a prolonged time. A different material, such as indium-tin-oxide (ITO), although outperforming ZnO in terms of suffering less degradation under moisture exposure, would still experience certain levels of degradation when exposed to both heat and moisture. A porous TCO film allows the moisture to reach the solar cell junction, thus degrading the solar cell performance drastically. Compared with polyvinyl fluoride (PVF) or polyethylene terephthalate (PET) films by conventional single-sided solar panels as a backside cover (or back sheet), the glass backside cover provides superior moisture-blockage capability, significantly improving the reliability of the bifacial panel. To prevent moisture ingress from the edges of the glass covers, in some embodiments, a moisture-resistance sealant, such as a butyl sealant, can be applied along the edges of the bifacial channel. In addition to glass, it is also possible to use a transparent polymer material to make backside cover 510, which provides a lighter weight bifacial panel.

In the example shown in FIG. 5, the solar cells are serially connected. More specifically, each row of solar cells is serially connected into a string using metal tabs, such as metal tabs 512 and 514 that connect the backside of solar cell 502 to the front-side of solar cell 504. Such metal tabs are usually soldered onto the busbars of the solar cells. In the example shown in FIG. 5, the solar cells have a conventional double-busbar configuration. At the end of the strings, a tabbing wire serially connects the cells at the end of the adjacent rows. For example, a tabbing wire 516 serially connects the rightmost cells at the first and the second row of solar cells in panel 500. As shown in FIG. 5, the serial connection zigzags through the entire panel until the last solar cell (solar cell 508) is connected. Additional lead wires are then attached to the unconnected tabs of the first and last cells (cells 502 and 508, respectively), thereby providing the positive and negative outputs of panel 500. For example, lead wire 522 connects to metal tabs applied to the front-side of solar cell 502, and lead wire 524 connects to metal tabs applied to the backside of solar cell 508. To prevent shading (either the front-side or the backside), lead wires 522 and 524 are placed along the edge of panel 500. In some embodiments, a plastic or rubber jacket is used to wrap around lead wires 522 and 524 to provide electrical insulation. In the example shown in FIG. 5, the ends of lead wires 522 and 524 are brought to the middle of the left edge of solar panel 500. It is also possible to bring those ends to the upper and lower ends of the left edge of solar panel 500, as long as such an arrangement does not lead to shading. In another embodiment, lead wires 522 and 524 are sandwiched between the front and back glass covers along the edges, and exit via holes drilled through the back glass cover to enable a junction box mounting on the back surface of the panel without any shading. In yet another embodiment, lead wires 522 and 524 can be sandwiched between the front and back glass covers along the edges, and exit via the edge of the glass covers to enable a junction box mounting on the panel edge without any shading.

Moreover, from FIG. 5, one can see that solar panel 500 no longer has a frame. Such a frameless design prevents any shading, especially shading to the backside of the panel, caused by the conventional Al-based frame. To support the solar panel, specially designed clamps can be applied at the edge of the panel where there are no cells, such as regions 532 and 534. In addition to using clamps to support the frameless solar panels, it is also possible to create empty spaces between rows, columns, or cells to insert support structures. In some embodiments, frames that are custom designed to prevent any front or back shading of the solar cells can be used to support the bifacial panels.

To further increase light absorption, light-capturing films (LCFs) can be applied to the no-cell areas on solar panel 500, such as regions 542 and 544, and regions overlapping the busbars. Applying the LCFs to areas that are not covered by the cells or are shaded by opaque materials is essential in bifacial panel. Unlike a single-sided panel which has an opaque (often white) backside cover to reflect light from these non-covered regions, a bifacial panel has a transparent backside cover, which causes the light to pass though the non-covered regions. By applying LCFs to those non-covered and shaded regions, more light can be collected. In some embodiments, the LCF has modulated refractive indices which cause light in the desired wavelength range (e.g., the visible range for typical solar cells) to be trapped inside the film, reflected sideways, and eventually captured by the solar cells. In some embodiments, the LCFs can include textured polymer films having a thickness of less than 200 µm. Note that the textured surface of the polymer films can ensure that light hit such a surface to be reflected sideways and to be captured by the solar cells.

In addition to applying LCFs onto non-covered and shaded regions on the solar panel, it is also possible apply LCF onto the busbars to reduce the amount of light reflected by the metal layers. More specifically, when light hits the LCF-covered busbars, instead of being reflected upward as in the case of bare metal busbars, the light will be trapped inside the film, reflected sideways, and eventually captured by the solar cells. In alternative embodiments, the busbars themselves can include a textured surface such that incident light hitting the busbars will be reflected sideways to be captured by the solar cells. In other words, the busbar themselves are becoming light-capturing busbars. The busbars can be textured using various methods, including but not limited to: mechanical grinding, etching, and laser surface texturing. The shapes of the surface texture can include but are not limited to: pyramids, inverted pyramids, half spheres, etc., which can be randomly or regularly distributed on the surface of the busbars. Note that there is no longer a need for applying the LCFs onto the busbars if the surface of the busbars is textured.

To ensure efficiency of the solar panel under non-ideal operating conditions, such as shading caused by falling debris, cloudy or low-radiation conditions, solar panel 500 may also implement the maximum power point tracking (MPPT) technology and bypass protection at the cell or cell-group level. In some embodiments, a respective solar cell or group of solar cells within a solar panel is coupled to an MPPT integrated circuit (IC) chip and a bypass diode.

To further reduce shading, on the front-side or the backside or both, one can change the busbar configuration from the double-busbar configuration to a single busbar or even a no busbar configuration. Using the single edge busbar configuration shown in FIG. 3C, one can achieve a solar panel with reduced busbar-induced shading and reduced series resistance.

Figure 6A:
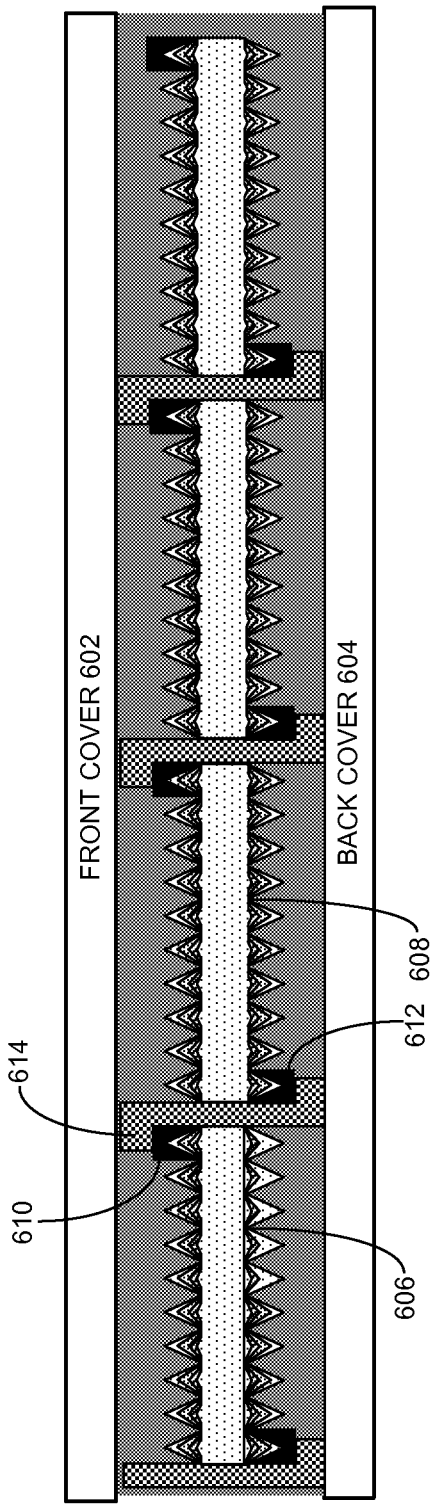
FIG. 6A presents a diagram illustrating the cross-sectional view of a string of serially connected solar cells having a single edge busbar configuration.

FIG. 6A presents a diagram illustrating the cross-sectional view of a string of serially connected solar cells having a single edge busbar configuration. In FIG. 6A, the solar cells are sandwiched between a front cover 602 and a back cover 604. In some embodiments, both the front and back covers are made of glass. The solar cells are laid out in such a way that the same polarity sides of the solar cells are facing the same direction. For example, solar cells 606 and 608 may both have their p-type emitters facing front cover 602. To enable a serial connection, a metal tab, such as metal tab 614, couples an edge busbar 610 located at the top surface of solar cell 606 and an edge busbar 612 located at the bottom surface of solar cell 608.

Figure 6B:
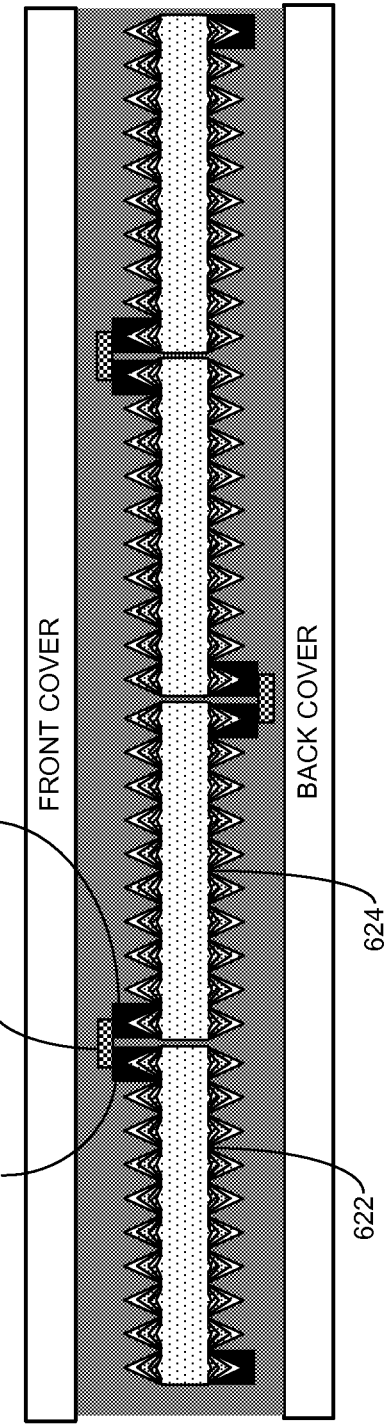
FIG. 6B presents a diagram illustrating the cross-sectional view of a string of serially connected solar cells having a single edge busbar configuration.

FIG. 6B presents a diagram illustrating the cross-sectional view of a string of serially connected solar cells having a single edge busbar configuration. In FIG. 6B, the solar cells are laid out in such a way that the same polarity sides of adjacent solar cells are facing opposite directions. For example, solar cell 622 may have its p-type emitter facing the front cover, and adjacent solar cell 624 may have its p-type emitter facing the back cover. To enable a serial connection, a metal tab, such as metal tab 630, couples an edge busbar 626 located at the top surface of solar cell 622 and an edge busbar 628 located at the top surface of solar cell 624.

Figure 6C:
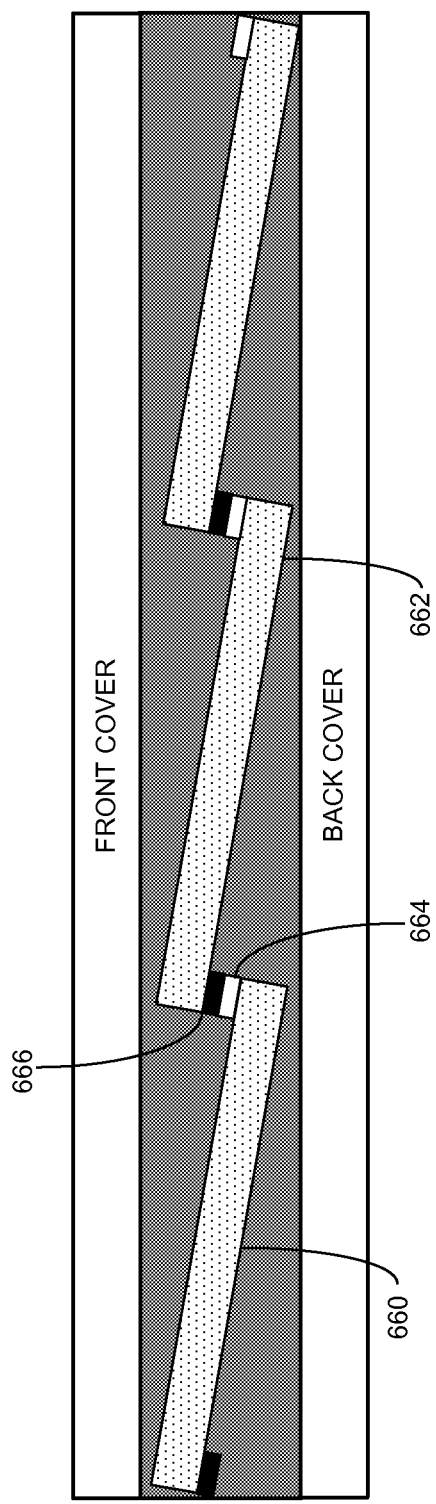
FIG. 6C presents a diagram illustrating the cross-sectional view of a string of serially connected solar cells having a single edge busbar configuration.

FIG. 6C presents a diagram illustrating the cross-sectional view of a string of serially connected solar cells having a single edge busbar configuration. In FIG. 6C, the solar cells are arranged in such a way that adjacent solar cells partially overlap at the edges, forming a shingled pattern. For example, solar cell 660 partially overlaps solar cell 662 in such a way that top edge busbar 664 of solar cell 660 is in direct contact with bottom edge busbar 666 of solar cell 662, thus enabling a serial connection between cells 660 and 662. From FIGS. 6A-6C, one can see that the single edge busbar generates less shading than a conventional double busbar, and the wide metal tabs connecting cells or the direct contact of the busbars can lead to reduced series resistance.

Details, including fabrication methods, about solar cells with the single edge busbar configuration can be found in U.S. patent application Ser. No. 14/510,008, entitled "Module Fabrication of Solar Cells with Low Resistivity Electrodes," by inventors Jiunn Benjamin Heng, Jianming Fu, Zheng Xu, and Bobby Yang, filed 8 Oct. 2014, the disclosure of which is incorporated by reference in its entirety herein.

Figure 7:
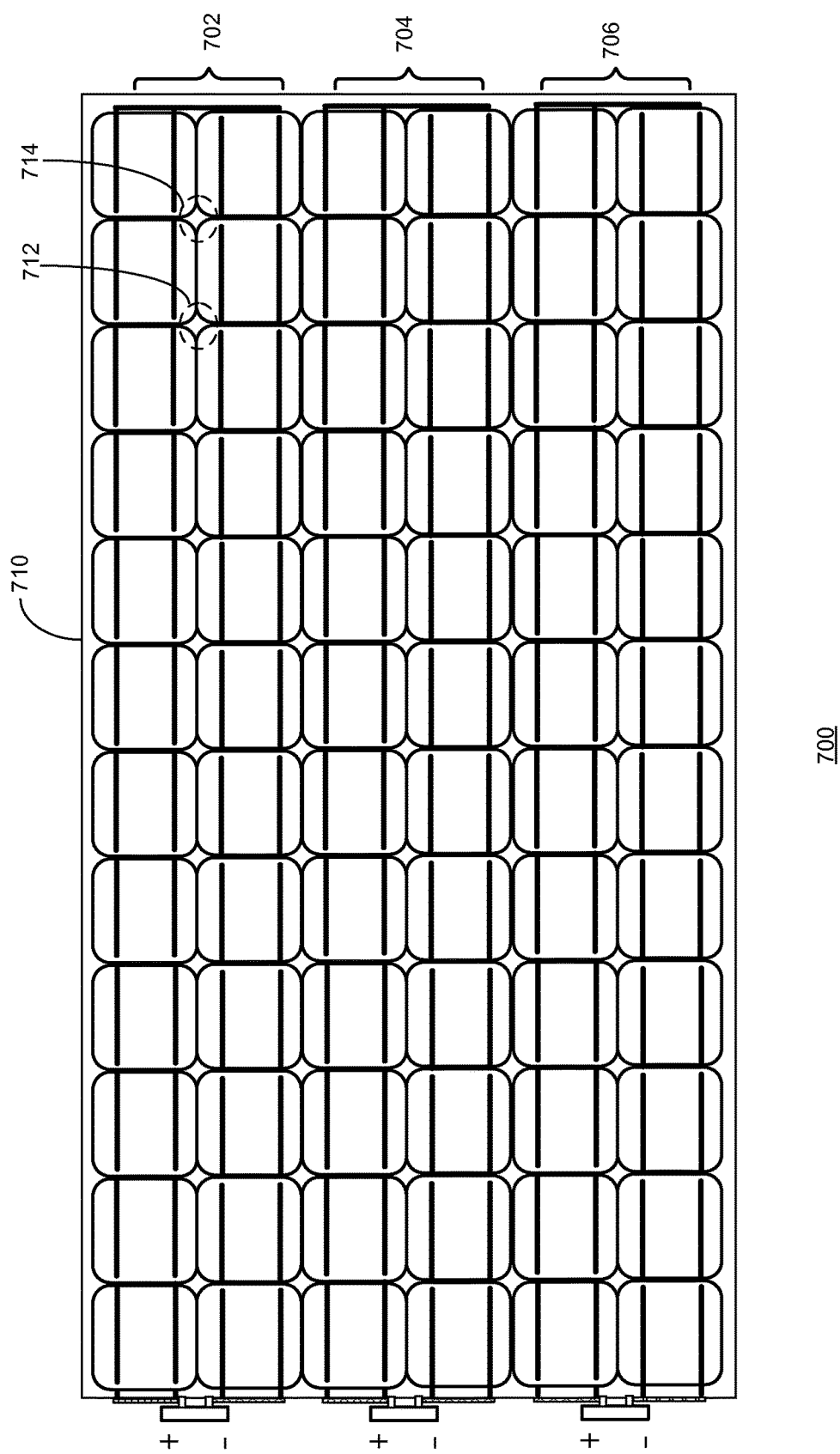
FIG. 7 presents a diagram illustrating the backside of an exemplary bifacial solar panel, in accordance with an embodiment of the present invention.

In FIG. 5, all solar cells are serially connected, meaning that the internal resistances of all the solar cells are summed as the panel resistance. The larger internal resistance of the panel leads to a larger portion of the photo-generated power being consumed by the panel's internal resistance and less power being outputted by the panel. Such a power penalty caused by the panel's internal resistance can be more severe for bifacial panels, because the photo-generated current is usually higher in a bifacial panel than in a single-sided panel, and the power consumed by the internal resistance is proportional to the square of the current. One way to increase the panel output power is to decrease the panel resistance. In some embodiments, instead of having all cells on the bifacial channel connecting in series, the bifacial panel can include parallel coupled strings of solar cells. More specifically, one or more rows of cells can be connected in series to form a string (or a group) of cells, and multiple strings (groups) can be connected to each other in parallel. FIG. 7 presents a diagram illustrating the backside of an exemplary bifacial solar panel, in accordance with an embodiment of the present invention.

In FIG. 7, a solar panel 700 includes a number of solar cell strings, such as strings 702, 704, and 706, sandwiched between a front-side cover (not shown) and a backside cover 710. Each string includes a number of serially connected solar cells. In the example shown in FIG. 7, each string includes two rows of solar cells, serially strung together by metal tabs, forming a "U," and solar panel 700 includes three such U-shaped strings. From FIG. 7, one can see that the outputs (including a positive output and a negative output) of the U-shaped strings are located at the same edge of solar panel 700, making it possible to establish parallel connections among the strings at such an edge, without shading the front or the backside of the solar panel.

Moreover, similar to the example shown in FIG. 5, light-capturing films (LCFs) are applied at panel spaces that are not covered by solar cells, such as regions 712 and 714, on solar panel 700. In some embodiments, the LCFs are also applied onto the busbars to reduce the amount of light reflected by the metal layers.

With the outputs of each string of cells located on the same edge of panel 700, various connections can be made at the edge. Coupling all positive outputs of the three strings together and all negative outputs of the strings together result in the three strings being connected in parallel. On the other hand, connecting the negative output of string 702 to the positive output of string 704, and then connecting the negative output of string 704 to the positive output of string 706 can result in the three strings being connected in series. Other configurations may also be possible. Note that the electrical cables used for the inter-string connections can be aligned and attached to the edge of solar panel 700, without shading the front or the backside of the solar panel.

As discussed previously, parallel connected solar cell strings can lead to reduced panel resistance. However, the parallel connection can also lead to reduced output voltage, making the panel incompatible with conventional panel with serially connected cells. To ensure compatibility, in some embodiments, solar cells of a standard size are each divided into multiple smaller cells, which are then connected in series. If the number of parallel strings in a panel is the same as the cell-dividing factor, then the output voltage and current of the solar panel with parallel strings can be similar to (but slightly higher than) those of the conventional panel with serially connected cells. For example, in FIG. 7, three U-shaped strings can be connected in parallel; hence, to ensure that the output voltage of the panel is at least as high as that of the conventional panel of the same size, each of the standard-sized solar cells needs to be divided into three smaller cells. A detailed description of the analysis regarding the cell division and the cell-division procedures can be found in U.S. Provisional Patent Application No. 62/075, 134, entitled "High Efficiency Solar Panel," by inventors Bobby Yang, Peter Nguyen, Jiunn Benjamin Heng, Anand J. Reddy, and Zheng Xu, filed 4 Nov. 2014, the disclosure of which is incorporated by reference in its entirety herein.

Figure 8:
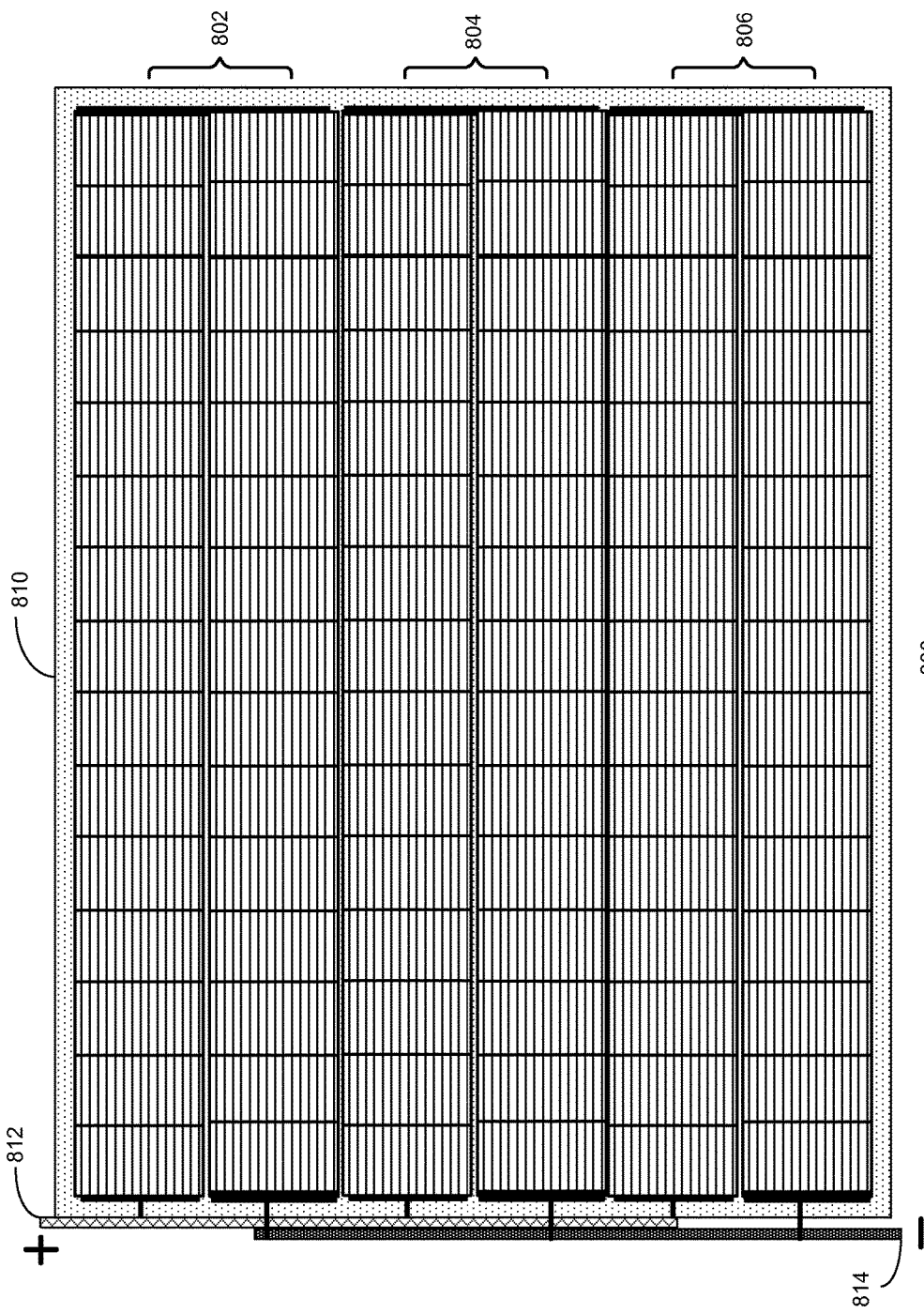
FIG. 8 presents a diagram illustrating the backside of an exemplary bifacial solar panel, in accordance with an embodiment of the present invention.

FIG. 8 presents a diagram illustrating the backside of an exemplary bifacial solar panel, in accordance with an embodiment of the present invention. In FIG. 8, a solar panel 800 includes a number of solar cell strings, such as strings 802, 804, and 806, sandwiched between a front-side cover (not shown) and a backside cover 810. Each string includes a number of serially connected smaller solar cells. Note that, here, the term "smaller solar cell" refers to a solar cell that is obtained by dividing a standard-sized solar cell, such as a standard 5-inch or 6-inch solar cell, into multiple smaller-sized cells. In most cases, a standard-sized cell is evenly divided into multiple smaller cells. For example, a 6-inch by 6-inch square or pseudo square shaped cell can be divided into three 2-inch by 6-inch smaller cells. Other cell sizes, shapes, and division schemes are also possible.

In the example shown in FIG. 8, each string includes two rows of smaller cells, serially coupled to each other, forming a "U," and solar panel 800 includes three such U-shaped strings. More specifically, the busbars on the smaller cells have the single edge busbar configuration, and adjacent smaller cells in each row are connected in series by partially overlapping each other at the corresponding edges. For example, the smaller cells in the topmost row are coupled in such a way that the right top edge busbar (when viewed from the backside of panel 800) of a cell is in direct contact with the left bottom edge busbar of the adjacent cell to the right. In other words, when viewed from the backside, the smaller cells are arranged in such a way that a right-side cell is partially on top of an adjacent left-side cell. On the other hand, such a pattern reverses itself at the adjacent serially connected row to have a left-side cell partially on top of an adjacent right-side cell.

Similar to panel 700 shown in FIG. 7, solar panel 800 includes three U-shaped strings, except that in solar panel 800, each string includes shingled smaller cells. The three U-shaped strings are connected in parallel at the left edge of solar panel 800. More specifically, the parallel connection is performed by using a cable or metal tab 812 to couple all positive outputs of the strings and a different cable or metal tab 814 to couple all negative outputs of the strings. Cables 812 and 814 are aligned along the edge of solar panel 800 with their leads at the opposite ends of the edge for connection to other panels. Note that such a wiring arrangement ensures no shading to either the front-side or the backside of the panels. In one embodiment, cables 812 and 814 can be routed to a junction box on the backside of the panel that does not shade any solar cells or a junction box on the edge of the panel. In some embodiments, other circuit components, such as MPPT devices and bypass diodes, can also be embedded at the panel edge.

Note that, in the example shown in FIG. 8, the shingled smaller cells cover most of the panel area, leaving no spaces between cells. Moreover, there are no longer visible busbars on either side. Hence, LCFs are no longer needed, except at the edges of the panel that are not covered by the smaller cells and at the space in between strings of shingled cells.

Figure 9:
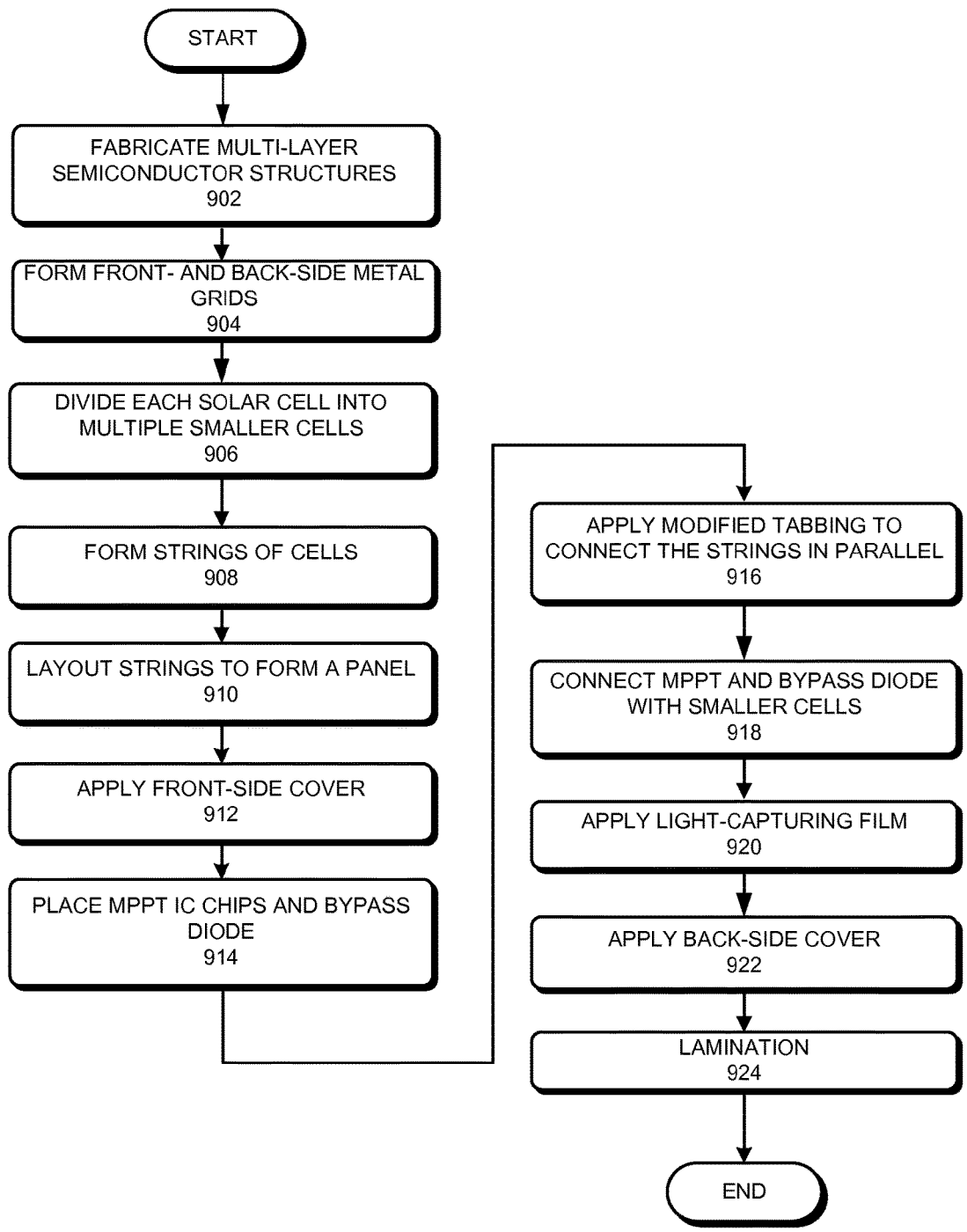
FIG. 9 presents a flow chart illustrating the process of fabricating a bifacial solar panel, in accordance with an embodiment of the present invention.

FIG. 9 presents a flow chart illustrating the process of fabricating a bifacial solar panel, in accordance with an embodiment of the present invention. During fabrication, multi-layer semiconductor structures for double-sided heterojunction solar cells are first fabricated using conventional standard-sized Si wafers (operation 902). In some embodiments, double-sided heterojunction semiconductor structures are fabricated using Si wafers of a standard size, such as the standard 5-inch or 6-inch squares. In some embodiments, the solar cells may also include front-side and/or backside QTB layers adjacent to the base layer and front and back TCO layers. To ensure optimal light absorption from both sides, in some embodiments, the front- and backside TCO layers have different thicknesses, and/or are made of different materials. More specifically, the front-side TCO layer is optimized for absorption of white light, whereas the backside TCO layer is optimized for absorption of scattered or diffused light that has a shorter wavelength.

Subsequently, front- and backside metal grids are deposited on the front and back surfaces of the solar cells, respectively, to complete the bifacial solar cell fabrication (operation 904). In some embodiments, depositing the front- and back-side metal grids may include electroplating of a Cu grid, which is subsequently coated with Ag or Sn. In further embodiments, one or more seed metal layers, such as a seed Cu or Ni layer, can be deposited onto the multi-layer structures using a physical vapor deposition (PVD) technique to improve adhesion and ohmic contact quality of the electroplated Cu layer. Different types of metal grids can be formed, including, but not limited to: a metal grid with a single busbar at the center and a metal grid with a single busbar at the cell edge. Note that for the edge-busbar configuration, the busbars at the front and back surfaces of the solar cells are placed at opposite edges. In some embodiments, the finger lines in the front- and backside metal grids have different spacing. More specifically, the spacing of the fingers on the front-side (the side that receives direct light) is optimized for light absorption, and the spacing of the fingers on the backside (the side that receives mostly scattered light) is optimized for lower series resistance. In further embodiments, the spacing of the fingers on the front-side of the solar cell is wider than that of the fingers on the backside of the solar cell. In some embodiments, the metal grids include busbars, and light-capturing films (LCFs) are applied to the busbars. In some embodiments, the metal girds include busbars, and forming the busbars involves texturing the surface of the busbars. Various methods can be used to texture the surface of the busbars, include but not limited to: mechanical grinding, etching, and laser surface texturing. The shapes of the surface texture can include but are not limited to: pyramids, inverted pyramids, half spheres, etc., which can be randomly or regularly distributed on the surface of the busbars. The LCF or the textured surface on the metal busbars ensures that light hitting the busbars will not be reflected upward, instead the light will be trapped inside the LCF or the textured metal surface, reflected sideways, and eventually captured by the solar cells.

Subsequent to depositing the front and back metal grids, in some embodiments, each solar cell is divided into multiple smaller cells (operation 906). Various techniques can be used to divide the cells. In some embodiments, a laser-based scribe-and-cleave technique is used. Note that, in order to prevent damage to the emitter junction, it is desirable to apply the laser scribing at the solar cell surface corresponding to the surface field layer. For example, if the emitter junction is at the front surface of the solar cell, the laser scribing should be applied to the back surface of the solar cell. Also note that dividing the solar cells into smaller cells is only necessary if the solar panel has groups of cells that are connected in parallel. In general, if all cells are connected in series, there is no need to divide the cells into smaller cells. The divided smaller cells with overlapping (shingled) layout configuration is preferred because it provides a number of added advantages, including: compact cell area without unused space, no busbars on front and back sides to cause shading, and reduced series resistance.

After the formation of the smaller cells, a number of smaller cells are connected together in series to form a string (operation 908). In some embodiments, two rows of smaller cells are connected in series to form a U-shaped string. Note that, depending on the busbar configuration, the conventional stringing process may need to be modified. In some embodiments, a row of smaller cells is connected in series by overlapping one another at the edges to form a shingled pattern. Note that such a shingled configuration provides multiple advantages, including: no exposed busbars on both front and back sides of the panel, thus reducing shading or eliminating the needs for LCFs; reduced series resistance without the use of ribbons; and a more compact layout without unnecessary blank space.

Subsequent to the formation of multiple strings of smaller cells, the multiple strings are laid out next to each other to form a panel (operation 910). In some embodiments, three U-shaped strings are laid out next to each other to form a panel that includes 6 rows of smaller cells. After laying out the strings, the front-side cover is applied (operation 912). In some embodiments, the front-side cover is made of glass.

For solar modules implementing cell-level MPPT or cell-level bypass protection, the MPPT IC chips and bypass diode can be placed at appropriate locations, including, but not limited to: corner spacing (if there is any) between solar cells, and locations between adjacent solar cells (operation 914). In some embodiments, the MPPT IC chips and bypass diode may be implemented at a multi-cell level or string level. In some embodiments, each row of smaller cells may be coupled to an MPPT IC and/or a bypass diode located at the panel edge.

The U-shaped strings are then connected to each other via a modified tabbing process (operation 916). More specifically, the strings are connected to each other in parallel with their positive electrodes coupled together to form the positive output of the panel and their negative electrodes coupled together to form the negative output of the panel. In some embodiments, metal cables wrapped by an insulation jacket are placed at the panel edge to connect to the respective positive and negative outputs of each U-shaped string. Electrical connections between the MPPT IC chips and bypass diodes and the corresponding smaller cell electrodes are formed to achieve a completely interconnected solar panel (operation 918). Note that the connection cables are placed in such a way as to ensure no shading to the front and backside of the solar panel. Subsequently, LCFs are applied at spaces on the panel that are not covered by the cells (operation 920), and the backside cover is applied (operation 922). In some embodiments, the backside cover is also made of glass. In some embodiments, the backside cover is made of transparent polymer, which can reduce the weight of the panel. The entire solar panel can then go through the normal lamination process, which seals the cells, the MPPT ICs, and the bypass diode in place (operation 924). Note that, compared with the process of making the traditional single-sided panel, there is no longer a need for the framing process and the attachment of a junction box, because this novel bifacial panel does not have a frame; neither does it have a junction box. The wiring of the entire panel, including among cells and to the MPPTs/bypass diodes, can be done during the lamination.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A bifacial solar panel, comprising:
   a first transparent cover on a first side of the solar panel;
   a second transparent cover on a second side of the solar panel;
   a plurality of photovoltaic structures sandwiched between the first cover and the second cover; and
   one or more lead wires for outputting power generated by the solar panel, wherein the lead wires are positioned on an edge of the solar panel without shading the first and second sides of the solar panel;
   wherein a respective photovoltaic structure has a long edge and a short edge, wherein the long edge is approximately n times the short edge, n being an integer greater than or equal to two;
   wherein the respective photovoltaic structure comprises:
      a first metallic grid comprising a first edge busbar positioned on a first side of the photovoltaic structure; and
      a second metallic grid comprising a second edge busbar positioned on a second side of the photovoltaic structure;
   wherein the first and second edge busbars are on opposite edges of the photovoltaic structure;
   wherein the plurality of photovoltaic structures are arranged into n subsets;
   wherein the photovoltaic structures in a respective subset are electrically coupled in series in a shingled configuration, with the first edge busbar of a respective photovoltaic structure overlapping with the second edge busbar of an immediately adjacent photovoltaic structure; and
   wherein the n subsets of the photovoltaic structures are electrically coupled in parallel.

2. The solar panel of claim 1, wherein the respective photovoltaic structure is a double-sided heterojunction solar cell comprising:
   a first transparent conducting oxide layer positioned on the first side of the photovoltaic structure; and
   a second transparent conducting oxide layer positioned on the second side of the photovoltaic structure.

3. The solar panel of claim 2, wherein the first and second transparent conducting oxide layers have different thicknesses, and wherein a thickness of the first transparent conducting oxide layer is configured for absorption of substantially white light by the photovoltaic structure, and wherein a thickness of the second transparent conducting oxide layer is configured for absorption of substantially scattered or diffused light by the photovoltaic structure.

4. The solar panel of claim 1, wherein the first and second metallic grids have different finger spacing.

5. The solar panel of claim 1, wherein the first and second edge busbars are covered with a light-capturing film.

6. The solar panel of claim 1, wherein surfaces of the first and second edge busbars are textured.

7. The solar panel of claim 1, wherein regions on the second cover that are not covered by the photovoltaic structures are covered with a light-capturing film.

8. The solar panel of claim 1, wherein the solar panel is frameless.

9. The solar panel of claim 1, wherein the solar panel further comprises a plurality of maximum power point tracking devices, wherein a respective maximum power point tracking device is coupled to a respective photovoltaic structure or a group of photovoltaic structures.

10. The solar panel of claim 1, wherein the first cover comprises glass, and wherein the second cover comprises glass or polymer.

* * * * *